(12) United States Patent
Jerng et al.

(10) Patent No.: US 9,246,535 B2
(45) Date of Patent: Jan. 26, 2016

(54) TRANSMIT RECEIVE FRONT END

(71) Applicant: MEDIATEK INC., Hsin-Chu (TW)

(72) Inventors: Albert Chia-Wen Jerng, Los Gatos, CA (US); Wen-Kai Li, Hsinchu County (TW); Chien-Cheng Lin, Taichung (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/683,109

(22) Filed: Apr. 9, 2015

(65) Prior Publication Data

US 2015/0222318 A1    Aug. 6, 2015

Related U.S. Application Data

(63) Continuation of application No. 13/246,868, filed on Sep. 28, 2011, now Pat. No. 9,031,517.

(51) Int. Cl.
*H04B 1/44* (2006.01)
*H04B 1/04* (2006.01)
*H04B 1/18* (2006.01)
*H03F 1/02* (2006.01)
*H03F 3/19* (2006.01)
*H03F 3/24* (2006.01)

(52) U.S. Cl.
CPC ............ *H04B 1/44* (2013.01); *H03F 1/0205* (2013.01); *H03F 3/19* (2013.01); *H03F 3/245* (2013.01); *H04B 1/0458* (2013.01); *H04B 1/18* (2013.01); *H03F 2200/222* (2013.01); *H03F 2200/294* (2013.01)

(58) Field of Classification Search
CPC .................... H04B 1/0458; H04B 1/18
USPC .................. 455/78, 73, 80, 83, 115.1
See application file for complete search history.

(56) References Cited

U.S. PATENT DOCUMENTS

| 6,356,536 | B1 * | 3/2002 | Repke ........................ 370/282 |
| 6,870,513 | B2 | 3/2005 | Deng |
| 6,982,609 | B1 | 1/2006 | McKay |
| 7,170,465 | B2 | 1/2007 | Rofougaran |
| 7,193,475 | B2 | 3/2007 | Su |
| 7,283,793 | B1 | 10/2007 | Mckay |
| 7,538,741 | B2 * | 5/2009 | Castaneda et al. ............ 343/859 |
| 7,567,142 | B2 | 7/2009 | Samavati |
| 7,737,783 | B2 | 6/2010 | Yamaguchi |
| 7,760,028 | B2 | 7/2010 | Sanduleanu |
| 7,831,214 | B1 | 11/2010 | Stockmann |
| 7,843,272 | B2 | 11/2010 | Yamaguchi |
| 7,869,771 | B2 | 1/2011 | Zolfaghari |
| 7,890,066 | B2 | 2/2011 | Rofougaran |
| 7,898,418 | B2 | 3/2011 | Safarian |
| 7,899,409 | B2 | 3/2011 | Huang |
| 7,979,043 | B2 | 7/2011 | Rofougaran |
| 8,005,437 | B2 | 8/2011 | Rofougaran |
| 8,022,786 | B2 | 9/2011 | Lee |

(Continued)

*Primary Examiner* — Marceau Milord
(74) *Attorney, Agent, or Firm* — Winston Hsu; Scott Margo

(57) ABSTRACT

The present invention discloses a transmit-receive (TR) front end. The TR front end comprises a low-noise amplifier (LNA); a power amplifier (PA); a transformer, coupled to the PA, for increasing a voltage swing and a power transmission of the PA; and a TR switch, coupled to the transformer at a first end and coupled to the LNA at a second end, wherein the second end is capable of being coupled to an antenna; wherein the LNA is single ended and there is no transformer between the LNA and the TR switch.

30 Claims, 3 Drawing Sheets

(56) References Cited

U.S. PATENT DOCUMENTS

| | | |
|---|---|---|
| 8,044,540 B2 | 10/2011 | Lee |
| 8,067,998 B2 | 11/2011 | McKay |
| 8,094,025 B2 | 1/2012 | Safarian |
| 8,138,853 B2 * | 3/2012 | Chu .............................. 333/101 |
| 8,229,367 B2 | 7/2012 | Chan |
| 8,301,186 B2 * | 10/2012 | Gorbachov ................ 455/550.1 |
| 8,368,481 B2 | 2/2013 | Jin |
| 8,472,894 B2 | 6/2013 | Wang |
| 8,576,005 B2 | 11/2013 | Liao |
| 8,626,084 B2 | 1/2014 | Chan |
| 8,712,342 B2 | 4/2014 | Maimon |
| 8,787,964 B2 * | 7/2014 | Soman ....................... 455/550.1 |
| 8,971,831 B2 * | 3/2015 | Vidojkovic et al. ........ 455/232.1 |
| 9,031,517 B2 * | 5/2015 | Jerng et al. ...................... 455/78 |
| 2006/0270377 A1 | 11/2006 | Bhatti |
| 2010/0029226 A1 | 2/2010 | Visser |
| 2010/0109798 A1 | 5/2010 | Chu |
| 2010/0321129 A1 | 12/2010 | Onody |
| 2011/0051670 A1 | 3/2011 | Safarian |
| 2011/0068636 A1 | 3/2011 | Lee |
| 2011/0171994 A1 | 7/2011 | Rajendran |

* cited by examiner

TRANSMIT RECEIVE FRONT END

CROSS REFERENCE TO RELATED APPLICATIONS

This is a continuation application of application Ser. No. 13/246,868, filed 2011 Sep. 28, which is included in its entirety herein by reference.

BACKGROUND OF THE INVENTION

1. Field of the Invention

The present invention relates to a transmit-receive front end, and more particularly, to a transmit-receive (TR) front end utilizing a single-ended low-noise amplifier (LNA) and not utilizing a transformer to eliminate signal loss of the LNA due to a transformer, and utilizing asymmetric 2 series switches in the LNA side, to enhance isolation from the power amplifier (PA) to the LNA during a transmission interval and eliminate power loss of the PA due to a TR switch.

2. Description of the Prior Art

Conventionally, a transmit-receive (TR) front end adopts many off-chip components, e.g. a transmit/receive switch, matching networks, transformers, and utilizes separate pins and matching networks for a differential low-noise amplifier (LNA) of a reception (Rx) side and a power amplifier (PA) of a transmission (Tx) side, which requires more cost and larger size on a printed circuit board (PCB).

For example, please refer to FIG. 1, which is a schematic diagram of a conventional TR front end 10. The TR front end 10 includes a LNA 100, a PA 102, separate transformers 104, 106, separate matching networks 108, 110, and a TR switch 112 coupled to an antenna 114. The LNA 110 is fully differential input and output for on-chip noise rejection. The PA 102 is also fully differential to increase the output voltage swing headroom by 6 dB theoretically. As a result, the transformers 104, 106 are required to convert single-ended antenna interfaces to differential circuit interfaces for the LNA 110 and the PA 102, respectively. Except for the LNA 100 and the PA 102, other front-end devices are off-chip components which occupy lots of PCB board area, i.e. the transformers 104, 106, the matching networks 108, 110, the TR switch 112 and the antenna 114. In general, the matching networks 108, 110 at TX and Rx are required to optimize the noise matching and power matching for the LNA 110 and the PA 102 respectively.

In operations of a wireless transceiver, different time intervals are used for transmission and reception. The function of the TR switch 112 during transmit intervals is to couple maximum power from the PA 102 to the antenna 114 and to prevent transmit signals from damaging an input of the LNA 100. On the other hand, the function of the TR switch 112 during receive intervals is to maximize signals from the antenna 114 to the input of the LNA 100 and minimize loss due to a loading effect of the PA 102.

However, although the prior art has flexibility to use high quality off-chip component to optimize transmission and reception performance separately, since there are many off-chip components, more cost and larger size are required on the PCB board. On the other hand, if the prior art directly replaces those off-chip components with on-chip components, large insertion loss may occur, which sacrifices the RF performance. Thus, there is a need for improvement over the prior art.

SUMMARY OF THE INVENTION

It is therefore an objective of the present invention to provide a transmit-receive (TR) front end utilizing a single-ended low-noise amplifier (LNA) and not utilizing a transformer to eliminate signal loss of the LNA due to a transformer, and utilizing asymmetric 2 series switches in the LNA side, to enhance isolation from the power amplifier (PA) to the LNA during a transmission interval and eliminate power loss of the PA due to a TR switch.

The present invention discloses a transmit-receive (TR) front end. The TR front end comprises a low-noise amplifier (LNA); a power amplifier (PA); a transformer, coupled to the PA, for increasing a voltage swing and a power transmission of the PA; and a TR switch, coupled to the transformer at a first end and coupled to the LNA at a second end, wherein the second end is capable of being coupled to an antenna; wherein the LNA is single ended and there is no transformer between the LNA and the TR switch.

The present invention further discloses a transmit-receive (TR) front end. The TR front end comprises a low-noise amplifier (LNA); a power amplifier (PA); a transformer, coupled to the PA, for increasing a voltage swing and a power transmission of the PA; and a TR switch, coupled to the transformer and the LNA; wherein the LNA is single ended, and the transformer and the TR switch are on-Chip.

The present invention further discloses a transmit-receive (TR) front end. The TR front end comprises a low-noise amplifier (LNA); a power amplifier (PA); a transformer, coupled to the PA, for increasing a voltage swing and a power transmission of the PA; and a TR switch, coupled to the transformer and the LNA; wherein the LNA is single ended, and the transformer and the TR switch are off-Chip These and other objectives of the present invention will no doubt become obvious to those of ordinary skill in the art after reading the following detailed description of the preferred embodiment that is illustrated in the various figures and drawings.

DETAILED DESCRIPTION

Figure 1:
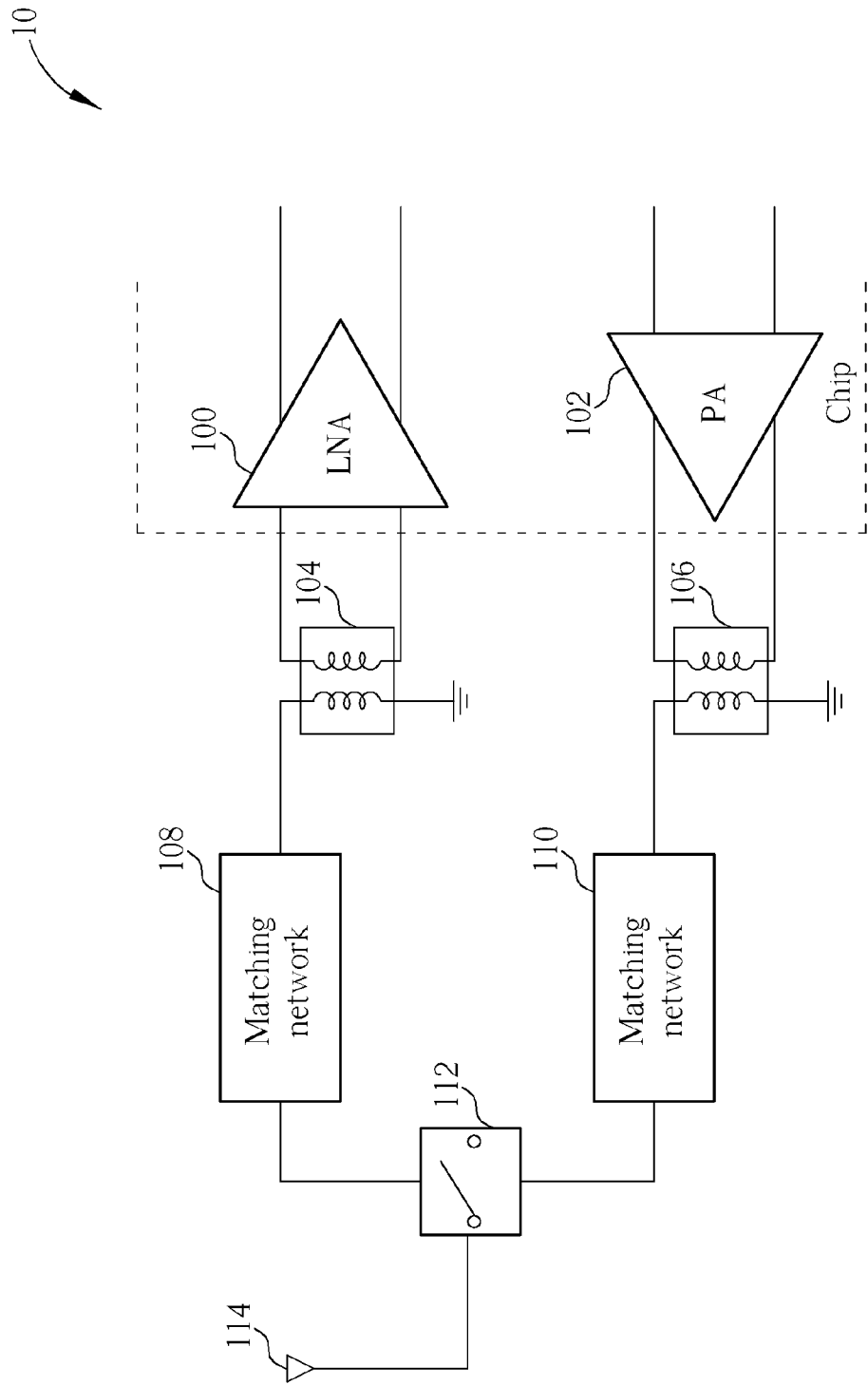
FIG. 1 is a schematic diagram of a conventional transmit-receive front end.
Figure 2:
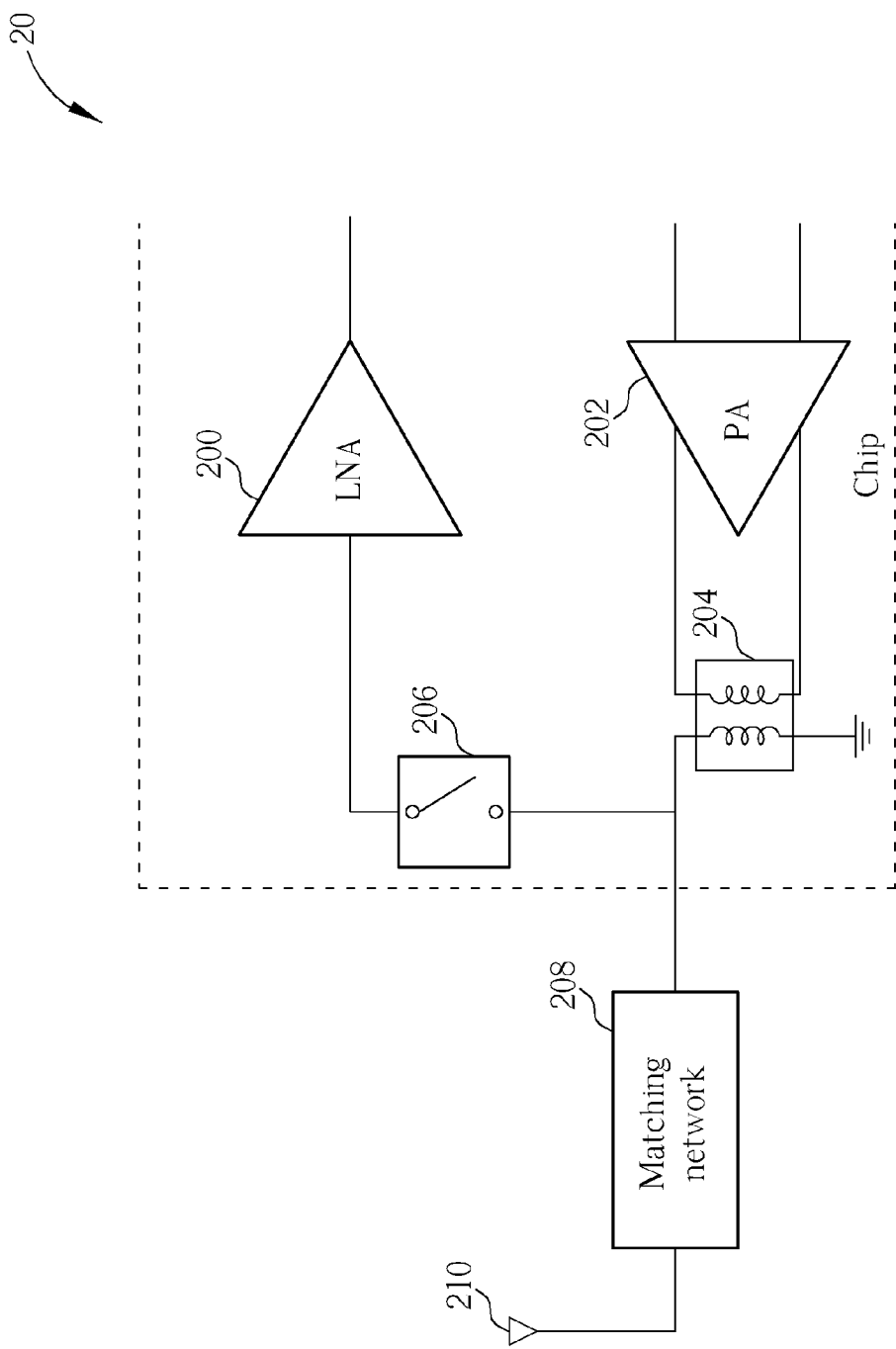
FIG. 2 is a schematic diagram of a transmit-receive front end according to an embodiment of the present invention.

Please refer to FIG. 2, which is a schematic diagram of a transmit-receive (TR) front end 20 according to an embodiment of the present invention. As shown in FIG. 2, the TR front end 20 includes a low-noise amplifier (LNA) 200, a differential power amplifier (PA) 202, a transformer 204, a matching network 208 and an antenna 210, wherein the LNA 200, the differential PA 202 and the transformer 204 are on-chip and the matching network 208 and the antenna 210 are off-chip. As a result, most components of the TR front end 20 are on-chip, which achieves compact size, low cost and less required pins, i.e. from 4 pins to 1 pin, and are properly designed to reduce power loss of the PA 202 and signal loss of the LNA 200.

Main differences between the TR front end 20 and the TR front end 10 are that the LNA 200 is single ended and there is no transformer between the LNA 200 and the TR switch 206, the TR switch 206 is an asymmetric 2 series switches in the LNA side and thus not in a path from the PA 202 to the antenna 210, and only the matching network 208 and the antenna 210 are off-chip. As a result, the present invention enhances isolation from the PA 202 to the LNA 200 during a transmission interval and eliminates power loss of the PA 202 due to a conventional TR switch and signal loss of the LNA 200 due to a transformer.

In detail, the transformer 204 combines two differential signals outputted by the differential PA 202 into one common mode signal, to increase a voltage swing and power transmission of the PA 202 6 dB without increasing a supply voltage of the PA 202. The matching network 208 optimizes a load impedance of the PA 202 and maximizes an output power of the PA 202 transmitted to the antenna 210. Besides, in order to reduce power loss from the PA 202 to the antenna 210, thus maximizing the transmitted power, the TR switch 206 is an asymmetric 2 series switches in the LNA side, and thus not in the path from the PA 202 to the antenna 210. As a result, the present invention eliminates the power loss of the PA 202 due to a conventional TR switch.

Under such a configuration, the TR switch 206 is switched off to provide isolation between the PA 202 and the LNA 200 during a transmission interval, i.e. protecting the LNA 200 from large output signals of the PA 202. The better the isolation provided by the TR switch 206, the more the power the PA 202 can transmit without hurting the LNA 200. In addition, the isolation of the TR switch 206 is also important to the PA 202 itself. If the isolation of the TR switch 206 is poor, the impedance variation due to large leakage voltage swing at an input of the LNA 200 will be transferred to the PA 202, such that an output impedance of the PA 202 varies with signals. When the output impedance of the PA 202 is not constant, the signal generated from PA 202 becomes nonlinear, making linearity of the PA 202. Therefore, the TR switch 206 is required to have better isolation to protect the LNA 200 better and guarantees less signal distortion of the PA 202 with high output power.

Figure 3:
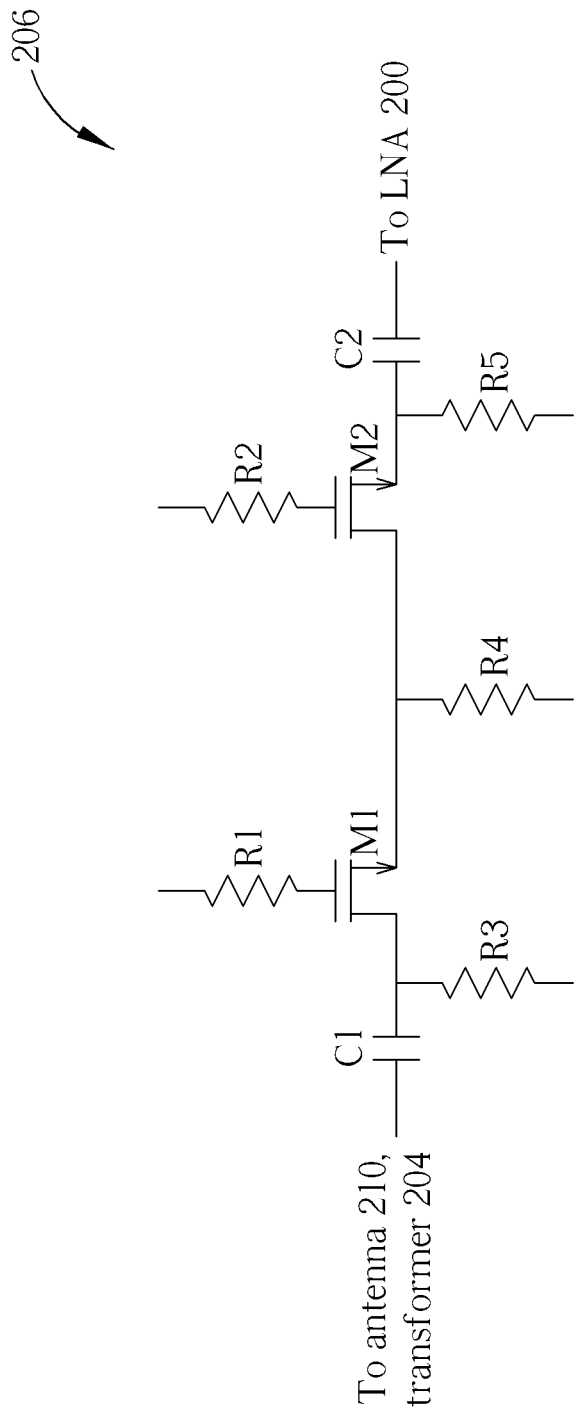
FIG. 3 is a schematic diagram of a transmit-receive switch shown in FIG. 2 according to an embodiment of the present invention.

Please refer to FIG. 3, which is a schematic diagram of the TR switch 206 shown in FIG. 2 according to an embodiment of the present invention. As shown in FIG. 3, the TR switch 206 mainly includes transistors M1, M2, resistors R1-R5 and capacitors C1, C2, and detailed structure and connection configuration are as shown in FIG. 3, where a second terminal of the transistor M1 is coupled to a first terminal of the transistor M2, the resistor R1 is coupled to a control terminal of the transistor M1, the resistor R2 is coupled to a control terminal of the transistor M2, the resistor R3 is coupled to a first terminal of the transistor M1, the resistor R4 has one terminal coupled between the second terminal of the transistor M1 and the first terminal of the transistor M2, the resistor R5 is coupled to a second terminal of the transistor M2, the capacitor C1 has one terminal coupled to the transformer 204 and the antenna 210, and another terminal coupled between the first terminal of the transistor M1 and the resistor R3, and the capacitor C2 has one terminal coupled to the LNA 200, and another terminal coupled between the second terminal of the transistor M2 and the resistor R5.

Noticeably, in the above embodiment, the transistors M1, M2 are N-type metal oxide semiconductor (MOS) transistors, and the first terminal, the second terminal, and the control terminal are a drain, a source and a gate, respectively. In another embodiment, the transistors M1, M2 can be P-type MOS transistors, and the first terminal, the second terminal, and the control terminal are a source, a drain and a gate, respectively. In a further embodiment, the transistors M1, M2 can be other transistors as long as corresponding modifications are made.

As shown in FIG. 3, the resistors R1-R5 are utilized for providing biases to the transistors M1, M2, so as to turn off both the transistors M1, M2 during a transmission interval, making isolation maximum, and turn on both the transistors M1, M2 during a reception interval. In detail, during the transmission interval, both the transistors M1, M2 are turned off. Therefore, the TR switch 206 provides twice isolation compared with that of the conventional TR switch 112 since there is only one transistor in the conventional TR switch 112, i.e. no transistor M2. The 2 series switches TR switch 206 has advantages such as wide bandwidth, small size, and the ease in handling small-signal performances, and reduces the voltage swing burden of each switch device in the OFF state. Besides, the capacitors C1, C2 act as direct current (DC) blockers to block DC power from the PA 202 and the LNA 200, respectively. As a result, the TR switch 206 can provide better isolation between the PA 202 and the LNA 200 during a transmission interval, to protect the LNA 200 better and guarantee less signal distortion of the PA 202 with high output power.

On the other hand, please continue to refer to FIG. 2. In order to reduce signal loss from the antenna 210 to the LNA 200 during the reception interval, thus improving the sensitivity, compared with the conventional differential LNA 110, the LNA 200 is single ended and there is no transformer between the LNA 200 and the TR switch 206, i.e. no transformer in a path from the LNA 200 to the antenna 210. In such a situation, there is no single-ended to differential conversion loss, e.g. balun loss. Besides, the LNA 200 can be a common-gate (CG) LNA to directly make interface to 50 ohms, which removes internal matching components and thus reduces loss and die area, and also simplifies the external matching network 208. As a result, the present invention eliminates the signal loss of the LNA 200 due to a transformer and provides better sensitivity.

Furthermore, during the reception interval, the TR switch 206 is switched on, i.e. both the transistors M1, M2 are turned on, and thus the input of the LNA 200 meets the loadings of the PA 202, the transformer 204 and the TR switch 206. To further reduce the insertion loss, the matching network 208, the TR switch 206 and the transformer 204 can be designed to simultaneously optimize input match of the LNA 200 and output match of the PA 202, e.g. an inductance of the transformer 204 can be designed to nullify parasitic capacitance of other devices at an operating frequency, so as to decouple matching requirements of the LNA 200 and the PA 202. As a result, the present invention can further reduce the insertion loss by optimizing the inductance of the transformer 204.

Please continue refer to FIG. 3, during the reception interval, since both the transistors M1, M2 are turned on, the TR switch 206 has more series resistance and larger noise compared with that of the conventional TR switch 112 since there is only one transistor in the conventional TR switch 112, i.e. no transistor M2. Therefore, the sizes of the transistors M1, M2 are designed to be large enough to reduce the series resistance. However, there is always a trade-off between the sires resistance and parasitic capacitance about switch size, i.e. the larger the switch size, the smaller the series resistance and the larger the parasitic capacitance. Therefore, other than providing biases to the transistors M1, M2, the resisters R1-R5 are used to the TR switch 206 as float as possible to reduce the parasitic effect and thus improve the insertion loss.

Noticeably, the spirit of the present invention is to utilize the single-ended LNA 200 and not utilize a transformer to eliminate signal loss of the LNA 200 due to a transformer, and to utilize the asymmetric TR switch 206 having 2 series switches in the LNA side, to enhance isolation from the PA 202 to the LNA 200 during the transmission interval and eliminate power loss of the PA 202 due to a TR switch. Those skilled in the art should make modifications or alterations accordingly. For example, although the TR switch 206 shown in FIG. 3 includes both the capacitors C1, C2 as DC blockers to block DC power from the PA 202 and the LNA 200, since the TR switch 206 is mainly utilized for providing better isolation from the PA 202 to the LNA 200 during the transmission interval to prevent the LNA 200 from being damaged, the TR switch 206 can only include the capacitor C1 as a DC blocker to block DC power from the PA 202. Besides, the TR switch 206 can include more than 2 transistors or other switches for providing better isolation, and is not limited to this.

In the prior art, although utilizing high quality off-chip component has flexibility to optimize transmission and reception performance separately, since there are many off-chip components, more cost and larger size are required on the PCB board. On the other hand, if the off-chip components are directly replaced with on-chip components, large insertion loss may occur, which sacrifices the RF performance. In comparison, most components of the present invention are on-chip, which achieves compact size, low cost and less required pins, and the present invention utilizes the single-ended LNA 200 and does not utilize a transformer to eliminate signal loss of the LNA 200 due to a transformer, and utilizes the asymmetric TR switch 206 having 2 series switches in the LNA side, to enhance isolation from the PA 202 to the LNA 200 during the transmission interval and eliminate power loss of the PA 202 due to a TR switch.

To sum up, the present invention achieves compact size, low cost and less required pins, and also reduces power loss of the PA 202 and signal loss of the LNA 200.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmit-receive (TR) front end, comprising:
a low-noise amplifier (LNA);
a power amplifier (PA);
a transformer, coupled to the PA, for increasing a voltage swing and a power transmission of the PA; and
a TR switch, coupled to the transformer at a first end and coupled to the LNA at a second end, wherein the second end is capable of being coupled to an antenna;
wherein the LNA is single ended and there is no transformer between the LNA and the TR switch.

2. The TR front end of claim 1, wherein the LNA, the PA, the transformer and the TR switch are on-chip.

3. The TR front end of claim 1 further comprising:
an antenna; and
a matching network, for optimizing a load impedance of the PA and maximizing an output power of the PA transmitted to the antenna;
wherein the antenna and the matching network are off-chip.

4. The TR front end of claim 1, wherein the TR switch is not in a path from the PA to the antenna.

5. The TR front end of claim 1, wherein the TR switch is switched off to provide isolation between the PA and the LNA during a transmission interval.

6. The TR front end of claim 1, wherein the TR switch comprises:
a first transistor, comprising a first terminal, a second terminal, and a control terminal;
a second transistor, comprising a first terminal, a second terminal, and a control terminal, the first terminal coupled to the second terminal of the first transistor;
a first resistor, coupled to the control terminal of the first transistor;
a second resistor, coupled to the control terminal of the second transistor;
a third resistor, coupled to the first terminal of the first transistor;
a fourth resistor, having one terminal coupled between the second terminal of the first transistor and the first terminal of the second transistor;
a fifth resistor, coupled to the second terminal of the second transistor; and
a first capacitor, having one terminal coupled to the transformer, and another terminal coupled between the first terminal of the first transistor and the third resistor.

7. The TR front end of claim 6, wherein the TR switch further comprises a second capacitor, having one terminal coupled to the LNA, and another terminal coupled between the second terminal of the second transistor and the fifth resistor.

8. The TR front end of claim 6, wherein the first transistor and the second transistor are N-type metal oxide semiconductor (MOS) transistors, and the first terminal, the second terminal, and the control terminal are a drain, a source and a gate, respectively.

9. The TR front end of claim 6, wherein the first transistor and the second transistor are P-type metal oxide semiconductor (MOS) transistors, and the first terminal, the second terminal, and the control terminal are a source, a drain and a gate, respectively.

10. The TR front end of claim 1, wherein the TR switch is switched on during a reception interval, and an inductance of the transformer nullifies parasitic capacitance at an operating frequency.

11. A transmit-receive (TR) front end, comprising:
a low-noise amplifier (LNA);
a power amplifier (PA);
a transformer, coupled to the PA, for increasing a voltage swing and a power transmission of the PA; and
a TR switch, coupled to the transformer and the LNA;
wherein the LNA is single ended, and the transformer and the TR switch are on-Chip.

12. The TR front end of claim 11, wherein there is no transformer between the LNA and the TR switch.

13. The TR front end of claim 11 further comprising:
an antenna; and
a matching network, for optimizing a load impedance of the PA and maximizing an output power of the PA transmitted to the antenna;
wherein the antenna and the matching network are off-chip.

14. The TR front end of claim 11, wherein the TR switch is not in a path from the PA to the antenna.

15. The TR front end of claim 11, wherein the TR switch is switched off to provide isolation between the PA and the LNA during a transmission interval.

16. The TR front end of claim 11, wherein the TR switch comprises:
a first transistor, comprising a first terminal, a second terminal, and a control terminal;
a second transistor, comprising a first terminal, a second terminal, and a control terminal, the first terminal coupled to the second terminal of the first transistor;
a first resistor, coupled to the control terminal of the first transistor;
a second resistor, coupled to the control terminal of the second transistor;

a third resistor, coupled to the first terminal of the first transistor;

a fourth resistor, having one terminal coupled between the second terminal of the first transistor and the first terminal of the second transistor;

a fifth resistor, coupled to the second terminal of the second transistor; and a first capacitor, having one terminal coupled to the transformer, and another terminal coupled between the first terminal of the first transistor and the third resistor.

17. The TR front end of claim 16, wherein the TR switch further comprises a second capacitor, having one terminal coupled to the LNA, and another terminal coupled between the second terminal of the second transistor and the fifth resistor.

18. The TR front end of claim 16, wherein the first transistor and the second transistor are N-type metal oxide semiconductor (MOS) transistors, and the first terminal, the second terminal, and the control terminal are a drain, a source and a gate, respectively.

19. The TR front end of claim 16, wherein the first transistor and the second transistor are P-type metal oxide semiconductor (MOS) transistors, and the first terminal, the second terminal, and the control terminal are a source, a drain and a gate, respectively.

20. The TR front end of claim 11, wherein the TR switch is switched on during a reception interval, and an inductance of the transformer nullifies parasitic capacitance at an operating frequency.

21. A transmit-receive (TR) front end, comprising:
a low-noise amplifier (LNA);
a power amplifier (PA);
a transformer, coupled to the PA, for increasing a voltage swing and a power transmission of the PA; and
a TR switch, coupled to the transformer and the LNA;
wherein the LNA is single ended, and the transformer and the TR switch are off-Chip.

22. The TR front end of claim 21, wherein there is no transformer between the LNA and the TR switch.

23. The TR front end of claim 21 further comprising:
an antenna; and
a matching network, for optimizing a load impedance of the PA and maximizing an output power of the PA transmitted to the antenna;
wherein the antenna and the matching network are off-chip.

24. The TR front end of claim 21, wherein the TR switch is not in a path from the PA to the antenna.

25. The TR front end of claim 21, wherein the TR switch is switched off to provide isolation between the PA and the LNA during a transmission interval.

26. The TR front end of claim 21, wherein the TR switch comprises:
a first transistor, comprising a first terminal, a second terminal, and a control terminal;
a second transistor, comprising a first terminal, a second terminal, and a control terminal, the first terminal coupled to the second terminal of the first transistor;
a first resistor, coupled to the control terminal of the first transistor;
a second resistor, coupled to the control terminal of the second transistor;
a third resistor, coupled to the first terminal of the first transistor;
a fourth resistor, having one terminal coupled between the second terminal of the first transistor and the first terminal of the second transistor;
a fifth resistor, coupled to the second terminal of the second transistor; and
a first capacitor, having one terminal coupled to the transformer, and another terminal coupled between the first terminal of the first transistor and the third resistor.

27. The TR front end of claim 26, wherein the TR switch further comprises a second capacitor, having one terminal coupled to the LNA, and another terminal coupled between the second terminal of the second transistor and the fifth resistor.

28. The TR front end of claim 26, wherein the first transistor and the second transistor are N-type metal oxide semiconductor (MOS) transistors, and the first terminal, the second terminal, and the control terminal are a drain, a source and a gate, respectively.

29. The TR front end of claim 26, wherein the first transistor and the second transistor are P-type metal oxide semiconductor (MOS) transistors, and the first terminal, the second terminal, and the control terminal are a source, a drain and a gate, respectively.

30. The TR front end of claim 21, wherein the TR switch is switched on during a reception interval, and an inductance of the transformer nullifies parasitic capacitance at an operating frequency.

* * * * *